United States Patent
Yoneda et al.

[11] Patent Number: 5,415,693
[45] Date of Patent: May 16, 1995

[54] PASTE APPLICATOR

[75] Inventors: Tomio Yoneda; Shigeru Ishida, both of Ibaraki; Haruo Mishina, Ushiku, all of Japan

[73] Assignee: Hitachi Techno Engineering Co., Ltd., Japan

[21] Appl. No.: 128,239

[22] Filed: Sep. 29, 1993

[30] Foreign Application Priority Data

Oct. 1, 1992 [JP]  Japan .................................. 4-263738
Oct. 2, 1992 [JP]  Japan .................................. 4-265057

[51] Int. Cl.⁶ ............................................. B05C 11/10
[52] U.S. Cl. ................................. 118/664; 118/670; 118/680; 118/679; 118/712
[58] Field of Search ............... 118/664, 668, 670, 679, 118/680, 675, 676, 712

[56] References Cited

U.S. PATENT DOCUMENTS

| | | | |
|---|---|---|---|
| 4,032,387 | 6/1977 | Sugiyama | 156/497 |
| 4,244,766 | 1/1981 | Yellen | 156/211 |
| 4,291,642 | 9/1981 | Kolc | 118/418 |
| 4,318,763 | 3/1982 | Bieler et al. | 156/198 |
| 4,458,412 | 7/1984 | Dean et al. | 29/705 |
| 4,704,181 | 11/1987 | Kubo | 156/423 |
| 4,762,578 | 8/1988 | Burgin, Jr. et al. | 156/64 |
| 4,804,435 | 2/1989 | Gelinas et al. | 156/379.6 |
| 4,919,746 | 4/1990 | Celia | 156/359 |
| 4,972,798 | 11/1990 | Ando et al. | 118/669 |
| 5,076,485 | 12/1991 | MacKay | 228/177 |

FOREIGN PATENT DOCUMENTS 2242521 10/1987 Japan.
2-52742 2/1990 Japan.

*Primary Examiner*—Robert J. Warden
*Assistant Examiner*—N. Bhat
*Attorney, Agent, or Firm*—Antonelli, Terry, Stout & Kraus

[57] ABSTRACT

A paste applicator for drawing a paste pattern on a substrate has X- and Y-axis tables, on which the substrate is mounted, and a paste reservoir tube, a nozzle, a nozzle support and an optical displacement meter all fixed to a Z-axis table in opposite relation to the substrate. The paste reservoir tube and the nozzle are communicated with each other by a horizontal portion of the nozzle support. The horizontal portion is extended to a position below the optical displacement meter so that the nozzle is located close to a measuring point of the optical displacement meter. This arrangement places the nozzle as close as possible to the measuring point of the optical displacement meter, whereby an error between data measured by the optical displacement meter and an actual nozzle-to-substrate gap is substantially eliminated to assure that the paste is applied to the substrate in a desired pattern and configuration.

6 Claims, 9 Drawing Sheets

F I G. 10
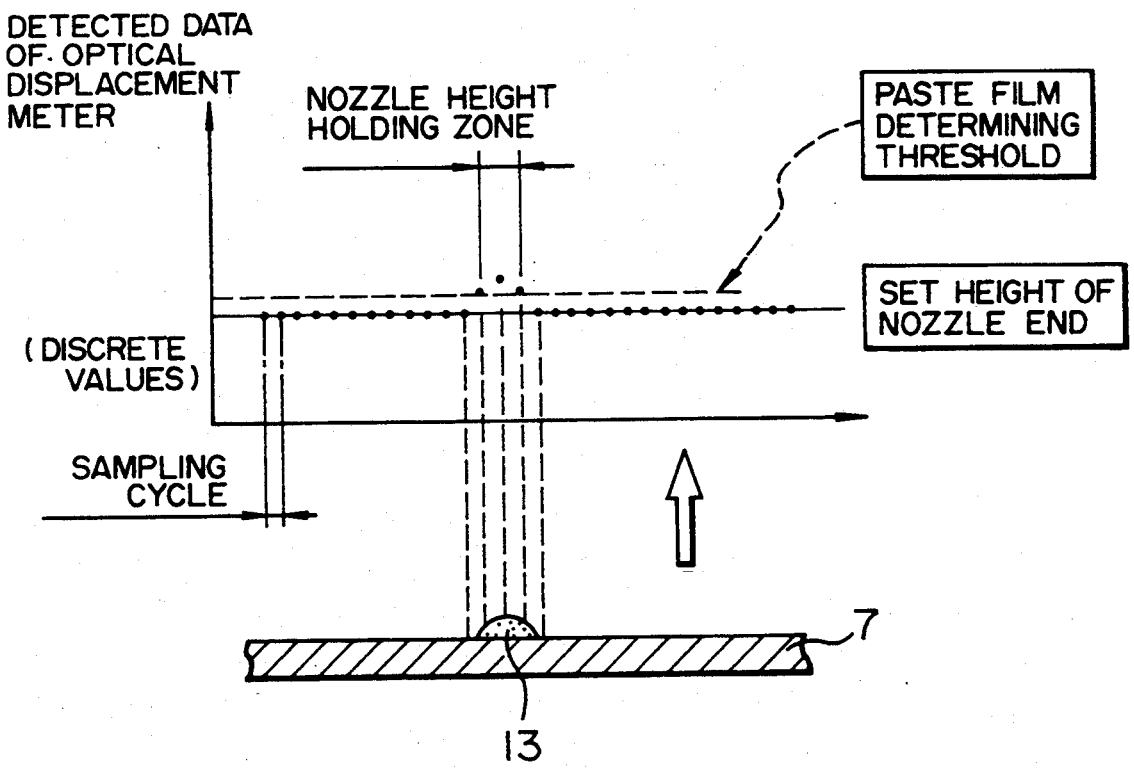

PASTE APPLICATOR

BACKGROUND OF THE INVENTION

1. Field of the Invention

The present invention relates to a paste applicator for discharging a paste onto a substrate through a nozzle and drawing a desired paste pattern on the substrate and, more particularly, to a paste applicator of the type that measures a gap between the nozzle and the substrate by a distance sensor and adjusts the gap between the nozzle and the substrate in accordance with the measured data of the distance sensor.

2. Description of the Prior Art

A paste applicator is an apparatus for drawing a paste pattern on a substrate by using a nozzle through which a paste is discharged, and employed in various fields as a drawing apparatus suitable for resistors of hybrid printed circuits, panel sealants of liquid crystal displays, etc.

In, for example, Japanese Patent Unexamined Publication No. 2-52742 an applicator is proposed wherein a paste, filled in a paste reservoir tube, is discharged onto a substrate through a nozzle provided at a distal end of the paste reservoir tube, and the nozzle and substrate are relatively moved in the horizontal direction by an X-Y table or the like, thereby drawing a paste film in a desired pattern on the substrate. The disclosed paste applicator includes a distance sensor capable of measuring a gap between the nozzle and the substrate, with the gap between the nozzle and the substrate being adjusted in accordance with measured data of the distance sensor to prevent irregularities of the pattern formed.

In the above conventional paste applicator, however, because the nozzle is provided at the center of the lower end of the paste reservoir tube and the gap is measured at a position just below the center of the distance sensor provided in side-by-side relation to the paste reservoir tube, a discharge port at the nozzle end and the measuring position of the distance sensor cannot be aligned and are offset with respect to each other in the horizontal direction. Accordingly, if undulations or fine irregularities are present on the substrate surface, an error is caused between the data of measurement detected by the distance sensor and the actual nozzle-to-substrate gap thereby requiring a complicated compensation means to correct such error.

Further, because the nozzle is provided at the lower end of the paste reservoir tube, if a paste of low viscosity is used, a further problem arises in that the paste is discharged through the discharge port at the nozzle end by gravity just after the paste is filled in the paste reservoir tube and the paste is applied to those locations where it is not to be drawn.

Additionally, the following problem has been experienced when liquid crystal sealing films are drawn on substrates for recent high-accurate liquid crystal displays by using the above conventional technique.

Namely, a new problem has been found relating to the above conventional discharge drawing technique that, when the measuring position of the distance sensor passes over an already drawn paste pattern with a certain thickness in the course of gap measurement, the nozzle and the substrate cannot be held at the desired gap, i.e., the nozzle height cannot be positioned at a set value of height, in those portions where a paste film is to be newly formed, and the width or height of the sealing film is increased in those portions, making it impossible to draw the desired sealing film.

SUMMARY OF THE INVENTION

A first object of the present invention is to provide a paste applicator in which a measuring position of a distance sensor and a discharge port at a nozzle end are set as close as possible for accurately drawing a desired pattern.

A second object of the present invention is to provide a paste applicator which can hold a desired gap between the nozzle and a substrate and can draw a desired pattern even when the measuring position of the distance sensor passes over a predrawn paste pattern with a certain thickness in the course of gap measurement.

To achieve the first object, the present invention provides a paste applicator in which a paste filled in a paste reservoir tube is discharged onto a substrate through a nozzle, with the nozzle and the substrate being relatively moved in the horizontal direction, and a gap between said nozzle and the substrate is adjusted in accordance with data measured by a distance sensor for drawing a desired paste pattern on said substrate. A conduit for introducing the paste is interposed between the paste reservoir tube and the nozzle, with the conduit being extended to a position below the distance sensor so that the nozzle is located substantially at a measuring position of the distance sensor, and the conduit and the distance sensor are fixed to a Z-axis table movable in the vertical direction.

In the present invention, the conduit connecting the paste reservoir tube and the nozzle to each other includes a horizontal portion.

With the arrangement of the paste reservoir tube and the nozzle coupled to each other by the conduit and with the conduit being extended to a position below the distance sensor so that the nozzle is located substantially at the measuring position of the distance sensor, a discharge port at the nozzle end and the measuring position of the distance sensor can be located as close as possible. Accordingly, the measured data detected by the distance sensor can be almost equal to the actual gap between the nozzle and the substrate. Thus, the gap between the nozzle and the substrate can be accurately measured by the distance sensor.

Also, the provision of the horizontal portion results in an increase in a line resistance imposed on the paste passing through the conduit. Therefore, fluidity of the paste is suppressed so as to prevent the paste from sagging or spilling by gravity through the discharge port at the nozzle end.

To achieve the second object, the paste applicator of the present invention further includes measurement means (distance sensor) for measuring the gap between the paste discharge port of said nozzle and the surface of said substrate, gap maintaining means, operative during a period in which a value measured by the measurement means exceeds a preset threshold, to maintain the gap between the paste discharge port of said nozzle and the surface of said substrate at the said value as obtained just prior to the value measured by to measurement means exceeds the threshold, and gap adjusting means operative, when the value measured by said measurement means does not exceed the threshold, to adjust the gap between the paste discharge port of to nozzle and the surface of the substrate to a predetermined value.

When the paste pattern is drawn on the substrate, the relative positional relationship between the paste discharge port of the nozzle and the substrate is changed by moving the substrate, for example, while the paste is discharged through the paste discharge port of the nozzle onto the substrate. At this time, the gap between the paste discharge port of the nozzle and the surface of the substrate is simultaneously measured by the measurement means and, in accordance with the measured result, the gap adjusting means adjusts the gap between the paste discharge port of the nozzle and the surface of the substrate to the preset value.

Depending upon the paste patterns to be drawn, the measuring position of the measurement means cross a paste film having been already formed. In this case, the measurement means judges that the gap between the paste discharge port of the nozzle and the surface of the substrate is substantially narrowed.

With the present invention, however, when the measured value of the measurement means exceeds the aforesaid threshold, the measuring position of the measurement means is judged to lie over the already formed paste film, so that the gap between the paste discharge port of the nozzle and the surface of the substrate is not changed but fixed to the same value same as one obtained just before such judgement is made. As a result, the paste pattern in a desired shape can be accurately drawn without any variation caused in the thickness and width of the paste film formed.

BRIEF DESCRIPTION OF THE DRAWINGS

FIG. 10 is a view for explaining one practical example of a method of determining whether the measuring position in FIG. 9 lies on the already formed paste film or not.

DESCRIPTION OF THE PREFERRED EMBODIMENTS

Hereinafter, embodiments of the present invention will be described with reference to the drawings.

Figure 1:
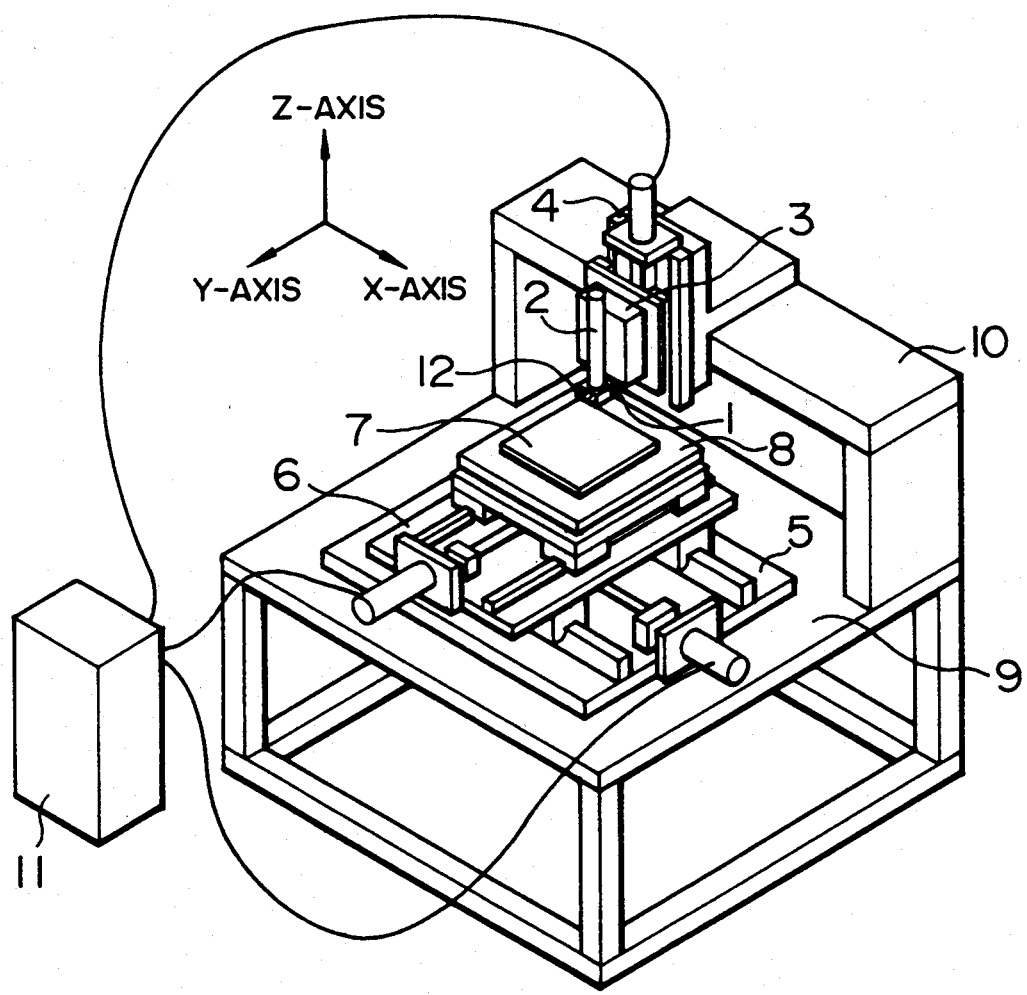
FIG. 1 is a perspective view of one embodiment of the paste applicator according to the present invention.

Referring to FIG. 1, the structure of one embodiment of the paste applicator according to the present invention includes a nozzle 1, a paste reservoir tube 2, an optical displacement meter 3, a Z-axis table 4, an X-axis table 5, a Y-axis table 6, a substrate 7, a substrate suctioning section 8, a mount 9, a Z-axis table support 10, a controller 11, and a nozzle support 12.

In FIG. 1, the X-axis table 5 is fixed on the mount 9 and the Y-axis table 6 is mounted on the X-axis table 5 movable in the X-axis direction. The substrate suctioning section 8 is mounted on the Y-axis table 6 movable in the Y-axis direction and the substrate 7 is fixed by suction on the substrate suctioning section 8 with its four sides extending parallel to the X- and Y-axis directions, for example. The X- and Y-axis tables 5 and 6 are controlled and driven by the controller 11 such that, when the X-axis table 5 is driven, the Y-axis table 6 is reciprocally moved in the X-axis direction and, when the Y-axis table 6 is driven, the substrate suctioning section 8 is reciprocally moved in the Y-axis direction. Accordingly, by moving the X- and Y-axis tables 5 and 6 over any desired distances by the controller 11, the substrate 7 can be moved in a horizontal plane parallel to the mount 9 in a desired direction and to a desired position.

The Z-axis table support 10 is installed on the surface of the mount 9 and the Z-axis table 4 is mounted on the Z-axis table support 10. The Z-axis table 4 is also controlled and driven by the controller 11. Fixed to the Z-axis table 4 are the nozzle support 12 for coupling the nozzle 1 and the paste reservoir tube 2 together, and the optical displacement meter 3 as a distance sensor. Accordingly, by moving the Z-axis table 4 over any desired distance by the controller 11, the nozzle support 12 and the optical displacement meter 3 can be moved in the Z-axis (vertical) direction correspondingly.

The optical displacement meter 3 has a light emitting device and a light receiving device. A light emitted from the light emitting device is reflected by the surface of the substrate 7 and the reflected light is received by the light receiving device. The distance to the surface of the substrate 7 is detected based on a difference in time between the light emission and the light reception. Results of the measurement by the optical displacement meter 3 are applied to a microcomputer of the controller 11. A set nozzle height, defining a thickness of the paste film to be drawn, is inputted into the microcomputer via a data input device (not shown) such as a keyboard or a touch panel and the input data is stored in a RAM (Random Access Memory) of the microcomputer. In addition to the RAM for storing various data input through the data input device, the microcomputer also has a ROM (Read Only Memory) for storing programs to operate the paste applicator of FIG. 1, a CPU for executing arithmetic operations, an input/output circuit for inputting and outputting various data therethrough, etc.

Figure 2:
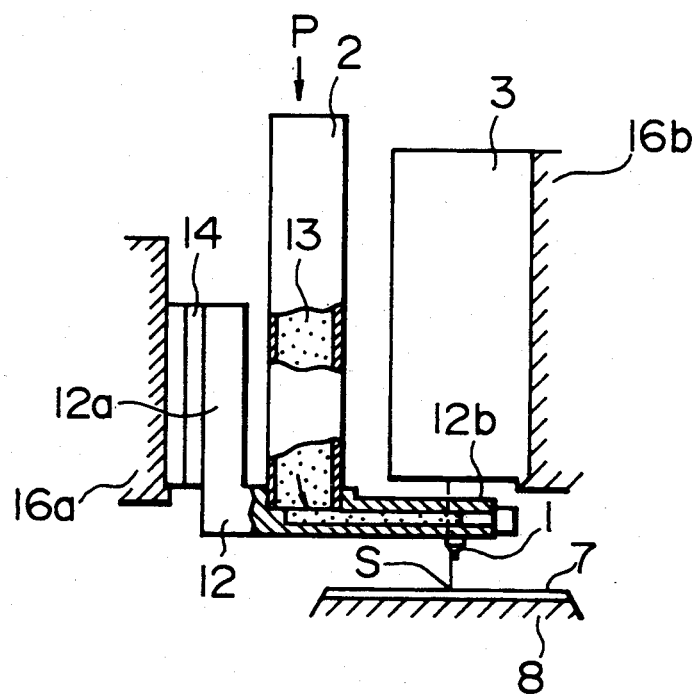
FIG. 2 is a side view showing the positional relationship between a nozzle of the paste applicator and an optical displacement meter shown in FIG. 1.

As shown in FIG. 2, the nozzle support 12 is of an L-shape comprising a vertical portion 12a and a horizontal portion 12b. The paste reservoir tube 2 is attached to an upper left end, as viewed in FIG. 2, of the horizontal portion 12b while the nozzle 1 is attached to a lower right end, as viewed in FIG. 2, of the horizontal portion 12b. Accordingly, a paste 13 filled in the paste reservoir tube 2 is introduced to the nozzle 1 through the horizontal portion 12b. Thus the horizontal portion 12b functions as a conduit for the paste 13. The vertical portion 12a of the nozzle support 12 is secured to a fixing portion 16a of the Z-axis table 4 via a slider 14, whereby the nozzle 1 and the paste reservoir tube 2 are attached to the Z-axis table 4 via the nozzle support 12.

Figure 3:
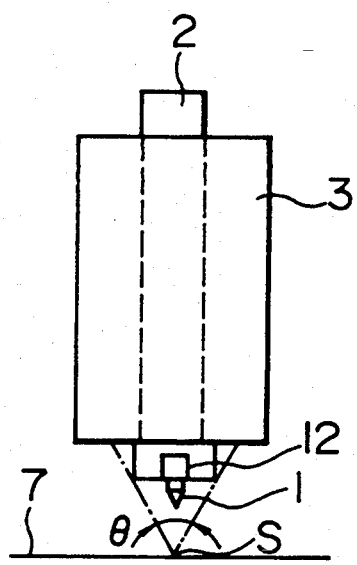
FIG. 3 is a front view showing the positional relationship between the nozzle of the paste applicator and the optical displacement meter shown in FIG. 1.

The optical displacement meter 3 is attached to another fixing portion 16b of the Z-axis table 4. With such an arrangement, although the paste reservoir tube 2 and the optical displacement meter 3 are disposed on the Z-axis table 4 in a side-by-side relationship with a predetermined spacing held therebetween in the horizontal direction, the horizontal portion 12b of the nozzle support 12 is extended to a position below the optical displacement meter 3, whereby a discharge port at the distal end of the nozzle 1 and a measuring position S (i.e., a gap measuring point) of the optical displacement meter 3 lie in positions adjacent to each other and are substantially coaxial in a vertical plane. Additionally, in order to prevent the horizontal portion 12b of the nozzle support 12 from interfering with any light rays of the optical displacement meter 3, i.e., the light emitted from the optical displacement meter 3 and the light reflected by the measuring position S on the substrate 7, the optical displacement meter 3 is arranged to provide a reflection angle $\theta$ between the emitted light and the reflected light, and the horizontal portion 12b of the nozzle support 12 is positioned within the range of the reflection angle $\theta$, as shown in FIG. 3.

The paste applicator according to this embodiment operates as follows. First, when electric power is turned on in a power-on step, the controller 11 executes an initialization step for positioning the Z-axis table 4, the X-axis table 5 the Y-axis table 6 to respective predetermined initial positions. In this initialization step, paste pattern data, substrate position data, paste discharge end position data and so on are also set. Then, the substrate 7 is mounted on the substrate suctioning section 8 in a substrate mounting step. While keeping the substrate 7 suctioned until the paste pattern is completely formed, the Z-axis table 4, the X-axis table 5 and the Y-axis table 6 are driven so as to carry out a paste film forming step.

In the paste film forming step, the microcomputer of the controller 11 compares the set nozzle height stored in the RAM with the measured data from the optical displacement meter 3 and drives the Z-axis table 4 so that the gap between the distal end of the nozzle 1 and the substrate 7 becomes equal to the set nozzle height. Stated otherwise, when the Z-axis table 4 is driven in accordance with the comparison data, the nozzle 1 is moved vertically together with the paste reservoir tube 2, the slider 14 and the optical displacement meter 3, whereby the distal end of the nozzle 1 is positioned so that its height takes a set value. Note that, in this embodiment, the set nozzle height corresponds to a thickness of the paste film to be formed. After the height of the distal end of the nozzle 1 is thus set, the X- and Y-axis tables 5 and 6 are driven by the controller 11 to horizontally move the substrate 7 on the substrate suctioning section 8 in both X- and Y-axis directions while the paste 13, filled in the paste reservoir tube 2, is discharged onto the substrate 7 through the discharge port at the distal end of the nozzle 1 by using compressed air or a piston in a predetermined discharge amount per unit of time, thereby directly drawing the paste film in a desired pattern.

After the paste pattern has been completely formed in the paste film forming step as explained above, the substrate 7 is removed (in a substrate removing step. When forming the paste pattern of the same pattern on a plurality of substrates 7, the process returns to the above substrate mounting step and then repeats the successive steps again up to the substrate removing step. The repeated process is ended at the time when there are no more substrates 7 to be processed.

With the embodiment of the described structure, the paste 13 filled in the paste reservoir tube 2 is introduced to the nozzle 1 through the horizontal portion 12b i.e., conduit of the nozzle support 12 and the horizontal portion 12b is positioned below the optical displacement meter 3, i.e., distance meter, so that the measuring position of the optical displacement meter 3 and the discharge port at the distal end of the nozzle 1 are disposed close to each other. Therefore, no significant errors are produced between the measured data of the optical displacement meter 3 and the actual gap between the nozzle 1 and the substrate 7, enabling the optical displacement meter 3 to accurately measure the gap between the nozzle 1 and the substrate 7. Also, since the horizontal portion 12b of the nozzle support 12 functions as a conduit for the paste 13 and since the line resistance of the conduit to the paste 13 is increased by the horizontal portion 12b, fluidity of the paste 13 between the paste reservoir tube 2 and the nozzle 1 is suppressed so as to prevent the paste from sagging or spilling by gravity through the discharge port at the distal end of the nozzle 1. It is thus possible to draw the paste film in a desired pattern thoroughly from the start to the end of the pattern.

It should be noted that while the above embodiment has been described as moving the nozzle 1 in the Z-axis direction with respect to the substrate 7 which is movable in the X- and Y-axis directions, the present invention is not limited to the above embodiment so long as the nozzle 1 can be relatively moved in the X, Y and Z-directions with respect to the substrate 7. For example, the paste film may be drawn by moving the nozzle 1 in the X, Y and Z-directions with the substrate 7 being fixed.

Also, while the above embodiment has been described to the effect that the nozzle 1 and the paste reservoir tube 2, which are coupled to each other by the nozzle support 12, and the optical displacement meter 3 are fixed to different points of the Z-axis table 4, these three components, i.e., the nozzle support 12, the nozzle 1 and the paste reservoir tube 2 may alternatively be secured to the optical displacement meter 3.

Further, while the above embodiment has been described to the effect that the nozzle 1 and the paste reservoir tube 2 connected to each other by the L-shaped nozzle support 12, the configuration and material of the nozzle support 12 can be selected variously. For example, an alternative arrangement may be such that the paste reservoir tube 2 is secured to the slider 14, the nozzle 1 is secured to the optical displacement meter 3, and the nozzle 1 and the paste reservoir tube 2 are connected to each other by a flexible pipe having a degree of elasticity so as to not deform under the necessary pressure applied to push out the paste.

Additionally, while the above embodiment has been described as employing a non-contact type optical displacement meter 3 as the distance sensor, a contact type distance sensor may be used instead.

Figure 4:
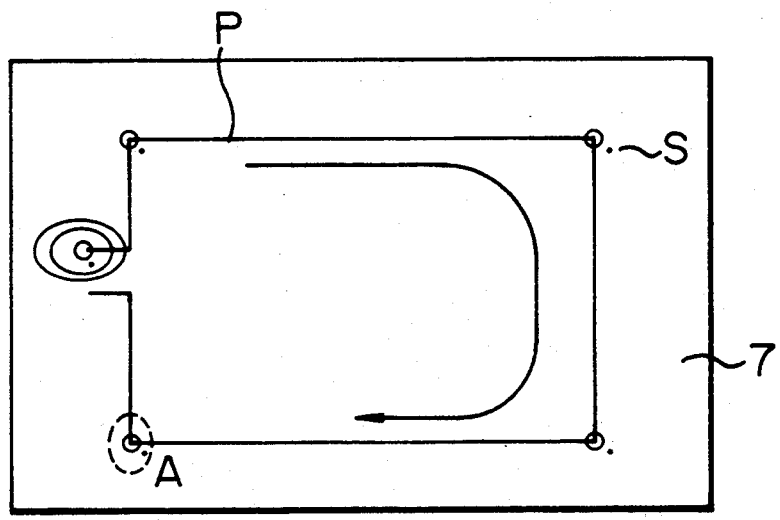
FIG. 4 is a view showing one example of a paste pattern drawn on a substrate by the embodiment shown in FIG. 1 and a process of drawing the paste pattern.

In FIG. 4, when the paste pattern is drawn in the direction of arrow, the drawing is started from a point surrounded by double circles and the X-axis table 5 or the Y-axis table 6 is changed in its direction of driving at each of points surrounded by a single circle.

A black dot near each position (paste applying point) surrounded by double circles or a single circle represents the measuring position S of the optical displacement meter 3 corresponding to that position. As will be seen from the illustrated positional relationship between each position surrounded by double circles or a single circle and the corresponding measuring position S, the measuring position S of the optical displacement meter 3 for each paste applying point of the nozzle 1 is directed obliquely at 45 degrees with respect to both the X- and Y-directions. Further, in the measurement by the optical displacement meter 3 for detecting the gap between the discharge port of the nozzle 1 and the surface of the substrate 7 at the measuring position S, the paste applying point of the nozzle 1 and the measuring position S of the optical displacement meter 3 are so very close to each other that a negligible level of the error in the measured value of the optical displacement meter 3 deviated from the actual gap between the discharge port of the nozzle 1 and the surface of the substrate 7 can be set not greater than 1 $\mu$m. In other words, the error range in the measurement of the optical displacement meter 3 for detecting the gap between the discharge port of the nozzle 1 and the surface of the substrate 7 is not greater than 1 $\mu$m.

When the paste pattern is drawn in the direction of the arrow in FIG. 4 and the paste applying point reaches a point A indicated by a dotted circle, the measuring position S of the optical displacement meter 3 now passes over the paste film having been already applied. On this occasion, the controller 11 judges that the measuring position S of the optical displacement meter 3 is passing over the already applied paste film, and continues, without driving the Z-axis table 4, application of the paste while keeping the gap between the discharge port of the nozzle 1 and the substrate 7 at a desired value. Upon judging that the measuring position S of the optical displacement meter 3 has passed over the already applied paste film, the controller 11 continues application of the paste while driving the Z-axis table 4 again.

As a result, the paste pattern as shown in FIG. 4 can be easily formed with no variation caused in its line width.

Figure 5:
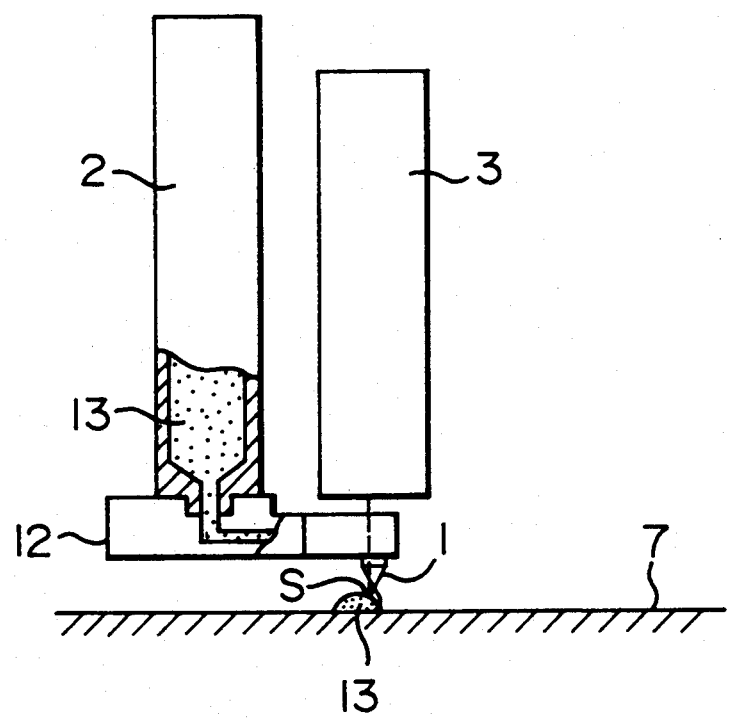
FIG. 5 is a view showing a situation that a measuring position of the optical displacement meter is passing over an already drawn paste film at a point A in FIG. 4.

FIG. 5 shows the situation in which the measuring position S of the optical displacement meter 3 is passing over the already applied paste film at the point A in FIG. 4.

In the situation shown in FIG. 5, the measuring position S of the optical displacement meter 3 lies over the already applied paste film and the distance from the surface of the already applied paste film to the discharge port of the nozzle 1 is measured. Therefore, if this situation is directly reflected in the driving of the Z-axis table 4, the Z-axis table 4 would be driven to move upwardly based on a judgment that the gap between the discharge port of the nozzle 1 and the substrate 7 is narrowed a dimension corresponding to the thickness of the paste film applied. In fact, however, the gap between the discharge port of the nozzle 1 and the substrate 7 is not changed. Accordingly, in this embodiment, the controller 11 does not drive the Z-axis table 4 and continues the drawing of the paste pattern while keeping the gap between the discharge port of the nozzle 1 and the substrate 7 unchanged.

Figure 6:
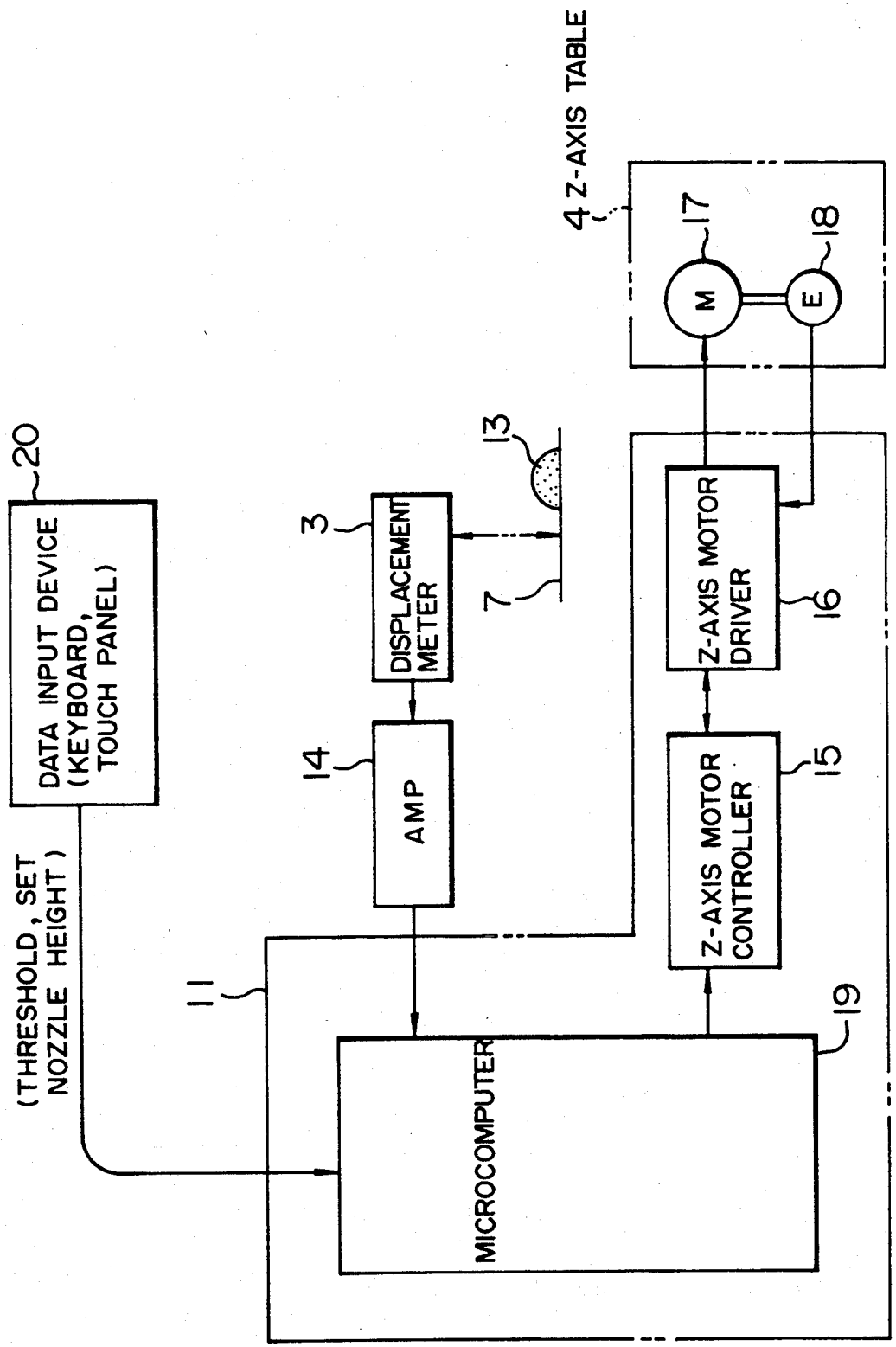
FIG. 6 is a block diagram showing one practical example of a control/drive system for use with the embodiment shown in FIG. 1.

FIG. 6 is a block diagram showing a control system used in this embodiment for executing the above-explained control/drive operation. Denoted by 14 is an amplifier, 15 is a Z-axis motor controller, 16 is a Z-axis motor driver, 17 is a motor, 18 is an encoder, 19 is a microcomputer, and 20 is a data input/output device.

The parts in FIG. 6 corresponding to those in the preceding drawings are denoted by the same reference numerals.

In FIG. 6, the controller 11 is formed by the microcomputer 19, the Z-axis motor controller 15, the Z-axis motor driver 16 and so on. The microcomputer 19 takes in data from the data input/output device 20, such as a keyboard or a touch panel, for specifying a configuration and film thickness (gap between the discharge port of the nozzle 1 and the substrate 7) of the paste pattern to be drawn, and also takes in the measured data output from the optical displacement meter 3 and amplified by the amplifier 14. The microcomputer 19 includes a RAM for storing various data such as input data from the data input/output device 20, a ROM for storing programs, a CPU (Central Processing Unit) for processing the data stored in the RAM in accordance with the programs to produce drive/control information for operating the paste application shown in FIG. 1 as described above, an input/output circuit for inputting and outputting various data therethrough, etc.

During a drawing of the paste pattern, the microcomputer 19 compares a value of the paste film thickness (hereinafter referred to as a film thickness threshold) specified in the input data stored in the RAM with the measured data from the optical displacement meter 3, and outputs a driving command value to the Z-axis motor controller 15 if the measured data is out of a sufficiently narrow range which includes the film thickness threshold. In response to the commanded value, the Z-axis motor controller 15 controls the Z-axis motor driver 16 to drive the motor 17 for vertically moving the Z-axis table 4 until the measured data from the optical displacement meter 3 falls in the sufficiently narrow range including the film thickness threshold. The gap between the discharge port of the nozzle 1 and the substrate 7 is thereby set to the specified value.

Additionally, the amount of rotation of the motor 17 is measured by the encoder 18 and the measured data is fed back to the Z-axis motor driver 16 for feedback control of the motor 17.

Figure 7:
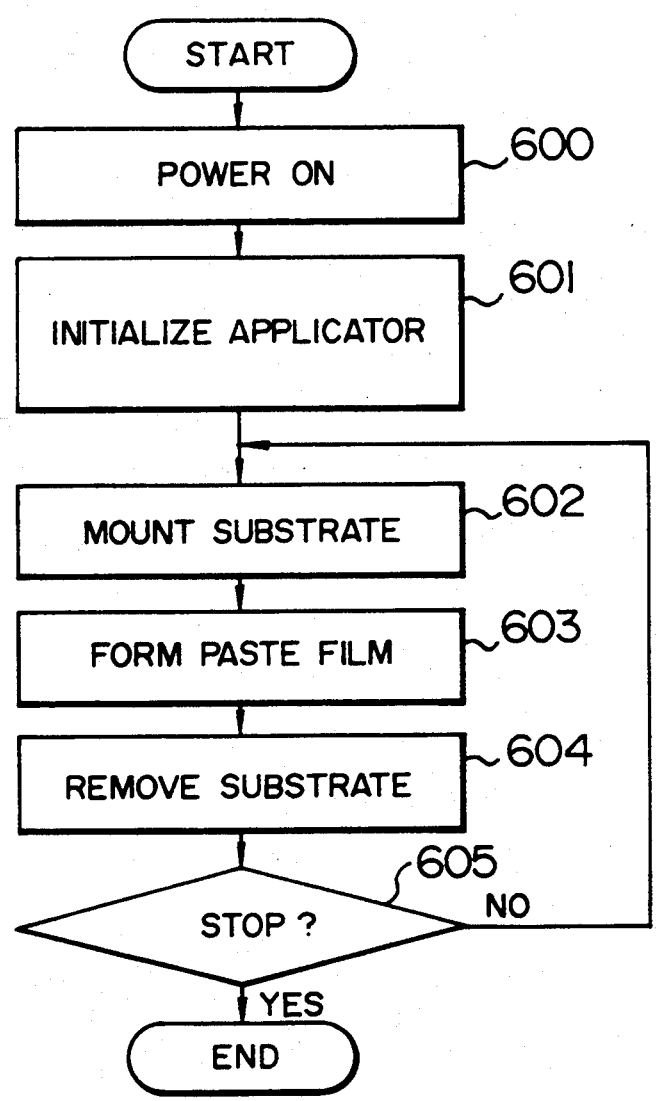
FIG. 7 is a flowchart showing overall operation of the embodiment shown in FIG. 1.

FIG. 7 is a flowchart showing an outline of the overall operation of the embodiment shown in FIG. 1.

Figure 8:
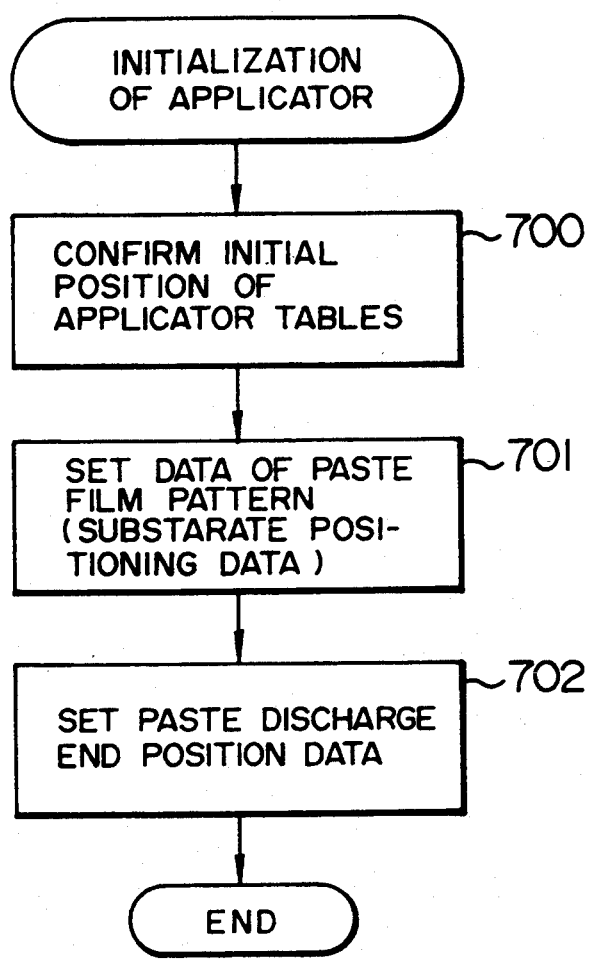
FIG. 8 is a flowchart showing details of an initializing step shown in FIG. 7.

In FIG. 7, when an electric power is turned on (step 600), the controller 11 executes an initialization (step 601). In this initialization, as shown in FIG. 8, the Z-axis table 4, the X-axis table 5 and the Y-axis table 6 are first positioned to respective predetermined initial positions (step 700), paste pattern data and substrate position data are then set (step 701) through the data input/output device 20 (FIG. 6), and further paste discharge end position data is set (step 702).

After completion of the initialization, as shown in FIG. 7, the substrate 7 is mounted on the substrate sucking section 8 and fixedly placed under suction (step 602), which is followed by a paste film forming step (step 603). The substrate 7 is kept in place under suction by the substrate sucking section 8 until the paste pattern is completely formed. After the paste pattern has been completely formed, the substrate 7 is removed out of the apparatus (step 604). If there still exists another substrate 7 on which the paste pattern is to be drawn (step 605), the above process from the step 602 is resumed for that substrate 7. At the time when the drawing of the paster pattern has been completed for all the substrates (step 605), the operation is brought into end.

Figure 9:
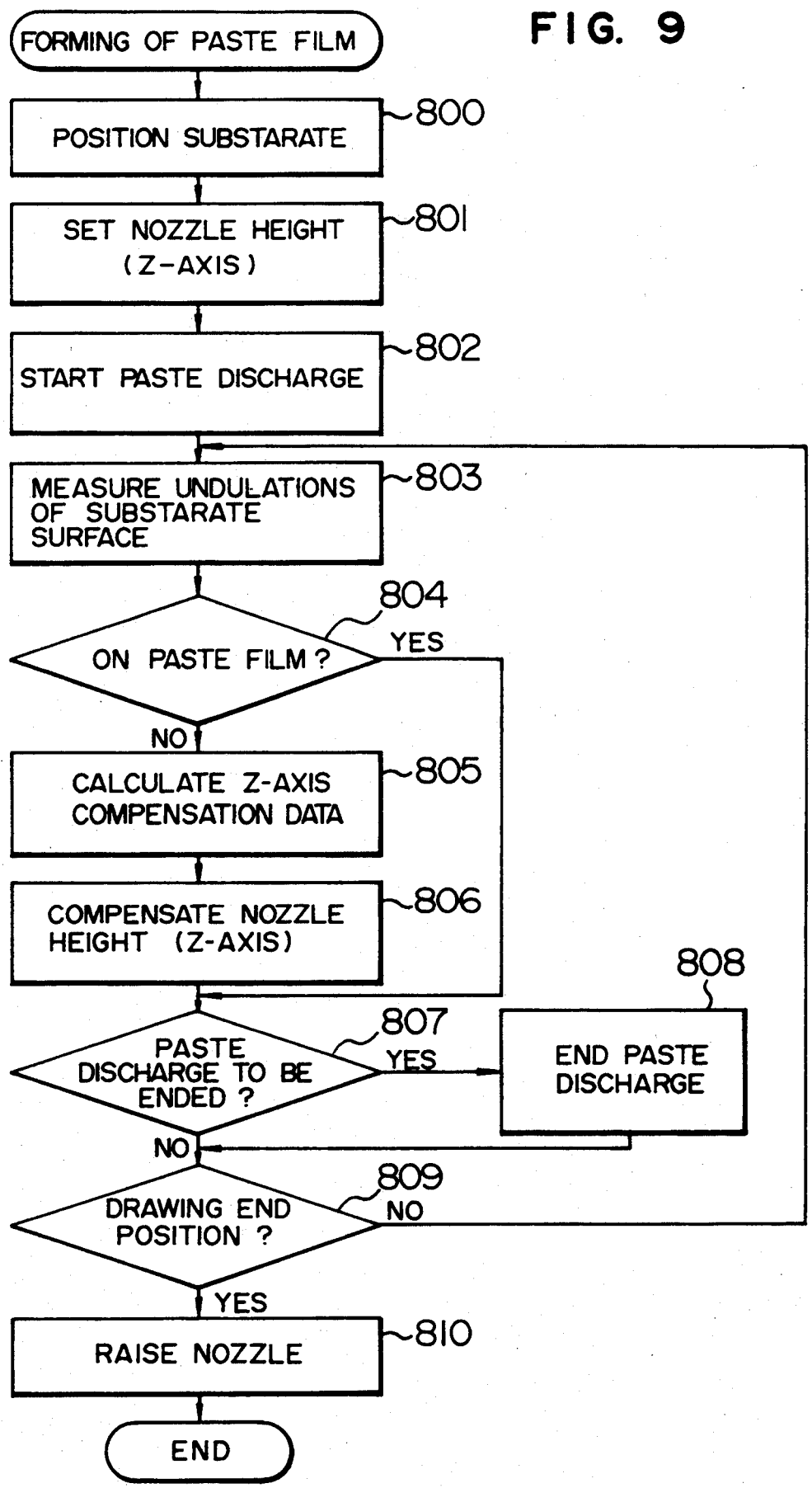
FIG. 9 is a flowchart showing details of a paste film forming step shown in FIG. 7.

FIG. 9 is a flowchart showing details of the paste film forming step (step 603) in FIG. 7.

Referring to FIG. 9, in order to obtain a desired pattern on the substrate 7, the controller 11 first drives the X-axis table 5 and the Y-axis table 6 so that the distal end of the nozzle 1 comes to a paste film forming start position on the substrate 7 (step 800). The nozzle 1 is then positioned at a set height for setting the gap between the surface of the substrate 7 and the discharge port of the nozzle 1 to a specified value (step 801). Next, the controller 11 starts discharging of the paste through the distal end of the nozzle 1 while driving the X-axis table 5 and the Y-axis table 6 (step 802).

Subsequently, the controller 11 takes in the measured data from the optical displacement meter 3 for measuring undulations on the surface of the substrate 7 (step 803), and determines based on the measured data whether the measuring position S of the optical displacement meter 3 lies on the already applied paste film or not (step 804). If the measuring position S is not on the paste film, then the Z-axis table 4 is vertically driven in accordance with the measured data so that the height of the discharge port of the nozzle 1 is compensated by an amount corresponding to a calculated correction value to maintain the gap between the discharge port of the nozzle 1 and the substrate 7 at the specified value (step 806). On the other hand, if it is determined that the measuring position S is passing over the paste film, then the steps 805 and 806 are skipped and the paste film forming operation is continued while the discharge port of the nozzle 1 is kept at the height the same as one obtained before the measuring position S has been determined to lie on the paste film.

When the measuring position S is passing over the paste film, the height of the discharge port of the nozzle 1 is not compensated. When the measuring position S passes over the paste film of a narrow width, the gap between the surface of the substrate 7 and the distal end of the nozzle 1 is changed little in many cases. Therefore, the controller stops compensating the height of the discharge port of the nozzle 1 to maintain the gap between the surface of the substrate 7 and the discharge port of the nozzle 1 as it is, so that the formed paste film can keep the same shape as just before the measuring position S has come over the paste film, so long as the paste discharging conditions are not varied during the stop of the compensation. Consequently, the paste pattern in a desired shape can be obtained.

After that, if the paste pattern is not completed, i.e., the end of the paste discharge from the paste reservoir tube 2 is not instructed (step 807) and the drawing end position is not reached (step 809), the controller returns to the step 803 for repeating the above operation again.

If the end of the paste discharge is instructed (step 807) after the drawing operation has been carried on by repeating a series of processing steps 803 to 807 and 809 and the entire paste pattern has been completely drawn, then the paste discharge is ended (step 808). Further, if the drawing end position is reached (step 809), then the Z-axis table 4 is driven to raise the nozzle 1 (step 810), thereby ending the paste pattern forming operation.

A method of determining whether the measuring position S of the optical displacement meter 3 lies on the paste film or not will now be described.

FIG. 10 is a view for explaining one practical example of the determining method and shows the results of detection of the gap between the discharge port of the nozzle 1 and the substrate 7 when the measuring position S of the optical displacement meter 3 passes over the paste film 13 applied to the substrate 7.

Referring to FIG. 10, a paste film determining threshold is set to have a value slightly higher than the set height of the discharge port of the nozzle 1 (i.e., the nozzle end). When a measured value (indicated by a black dot) of the optical displacement meter 3 obtained at a predetermined sampling cycle exceeds the paste film determining threshold, the measuring position S is judged to lie on the paste film.

Figure 11:
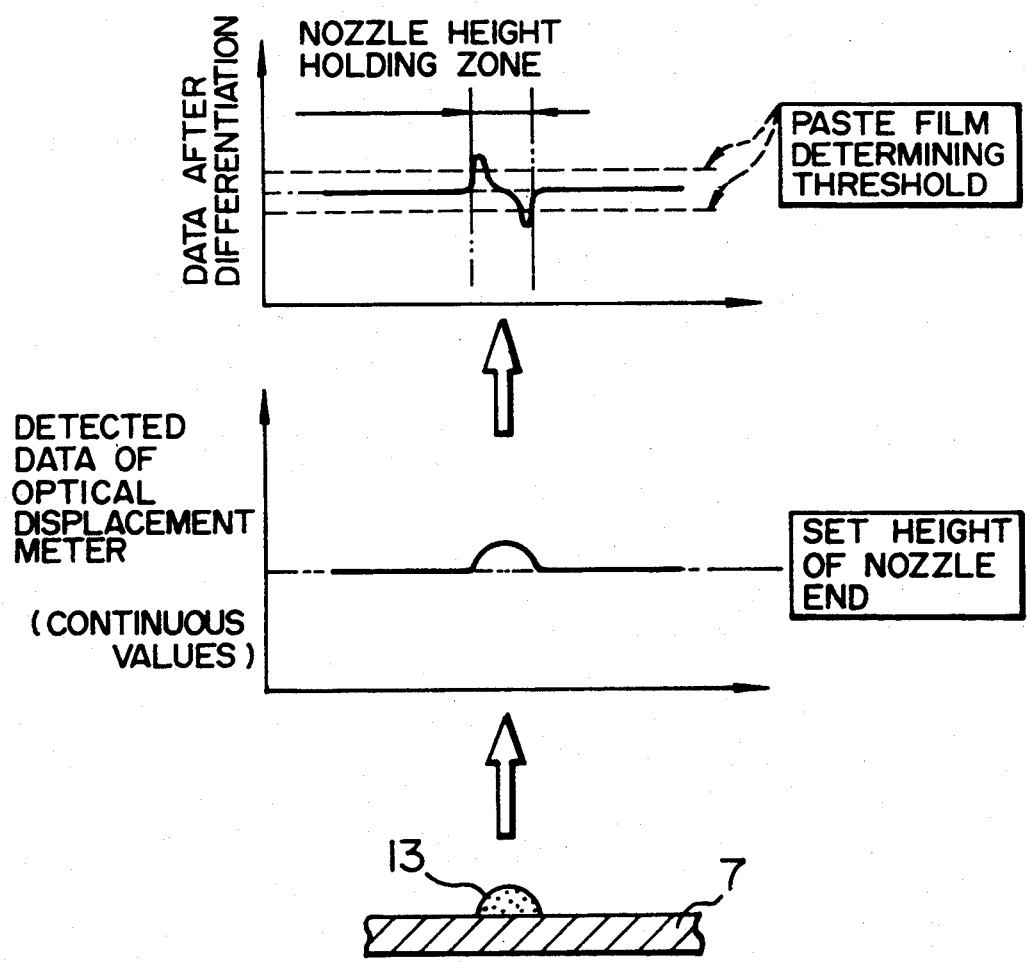
FIG. 11 is a view for explaining another practical example of a method of determining whether the measuring position in FIG. 9 lies on the already formed paste film or not.

FIG. 11 is a view for explaining another practical example of the determining method.

In this example, the measured data of the optical displacement meter 3 are obtained as continuous values and subjected to differentiation. Determining thresholds (i.e., paste film determining thresholds) are set to define a predetermined range with respect to the waveform obtained from the differentiation. When the differentiated value first departs from the predetermined range, the measuring position S is judged to come over the paste film and, when the differentiated value next departs from the predetermined range, the measuring position S is judged to have left the paste film.

It should be noted that, while embodiments of the present invention have been described, the invention is not limited to the illustrated embodiments. For example, in FIG. 9, the step 800 may be executed after the step 801.

As described above, according to the present invention, since a measuring position of a distance sensor and a discharge port at a nozzle end are placed as close as possible due to the provision of conduit, a paste film can be accurately applied in a desired pattern. Also, in the case where the conduit is provided with a horizontal portion, line resistance imposed on the paste passing through the conduit portion is increased. Therefore, fluidity of the paste is so suppressed as to prevent the paste from sagging or spilling by gravity through the discharge port at the nozzle end.

Further, according to the present invention, even when the measuring position of the distance sensor passes over the paste film having been already applied, the gap between the paste discharge port of the nozzle and the surface of a substrate can be held at a specified desired value. It is thus possible to cause the entire paste pattern to be drawn in uniform thickness and width.

What is claimed is:

1. A paste applicator comprising:

a table for holding a substrate substantially horizontally;

a paste reservoir tube in which a paste is to be filled;

a nozzle communicating with said paste reservoir tube and having a paste discharge port opposing to an upper surface of said substrate held on said table;

means for moving at least one of said nozzle and said table relative to the other of said nozzle and said table in at least one of two directions normal to each other and discharging the paste through said nozzle to draw a desired pattern of the paste on said substrate during the relative movement;

measurement means for measuring a gap between said substrate and the paste discharge port of said nozzle;

gap adjusting means for adjusting the gap between said substrate and the paste discharge port of said nozzle in accordance with results from the measurement by said measurement means, to thereby keep said gap substantially at a desired value;

said nozzle being disposed close to a point where said measurement means measures the gap between said substrate and the paste discharge port of said nozzle; and a conduit including a horizontal portion and connecting said nozzle and said paste reservoir tube together in a fluid flow communication.

2. A paste applicator according to claim 1, wherein said paste reservoir tube, said nozzle, said conduit and said measurement means are fixed to another table movable in a direction perpendicular to said table.

3. A paste applicator in which a paste filled in a paste reservoir tube is discharged therefrom onto a substrate through a nozzle, said nozzle and said substrate are relatively moved in the horizontal direction, and a gap between said nozzle and said substrate is adjusted in accordance with the data obtained by a measurement conducted by a distance sensor, whereby a desired paste pattern is drawn on said substrate, wherein a conduit for conveying the paste therethrough is interposed between said paste reservoir tube and said nozzle, said conduit extends substantially horizontally to a position below said distance sensor so that said nozzle is located substantially at a measuring position of said distance sensor, and said conduit and said distance sensor are fixed to a Z-axis table movable in the vertical direction.

4. A paste applicator comprising:
a table for holding a substrate;
a paste reservoir tube in which paste is to be filled;
a nozzle communicating with said paste reservoir tube and having a paste discharge port opposing to an upper surface of said substrate held on said table;
means for moving at least one of said nozzle and said table relative to the other of said nozzle and said table in at least one of two directions normal to each other and discharging the paste through said nozzle to draw a desired pattern of the paste on said substrate during the relative movement;
measurement means for measuring a gap between said substrate and the paste discharge port of said nozzle;
gap maintaining means operative, during a period in which a result of the measurement by said measurement means exceeds a preset threshold, to maintain the gap between said substrate and the paste discharge port of said nozzle at a value the same as one obtained just before the result of the measurement by said measurement means exceeds said threshold; and
gap adjusting means operative, when the result of the measurement by said measurement means does not exceed said threshold, to adjust the gap between said substrate and the paste discharge port of said nozzle in accordance with the result of the measurement by said measurement means, thereby keeping the gap between said substrate and the paste discharge port of said nozzle substantially at a desired value.

5. A paste applicator according to claim 4, wherein said gap maintaining means includes means for inputting a desired value of the gap between said substrate and the paste discharge port of said nozzle and a threshold for said desired value.

6. A paste applicator in which a substrate is held on a movable table in opposite-relation to a paste discharge port of a nozzle provided on a paste reservoir tube and said substrate is moved relative to said nozzle while a paste filled in said paste reservoir tube is discharged through said nozzle and a desired paste pattern is drawn on said substrate, said paste applicator comprising:
a distance sensor for measuring a gap between the discharge port of said nozzle and a surface of said substrate; and
control means for adjusting the gap between the discharge port of said nozzle and the surface of said substrate in accordance with an output of said distance sensor,
said control means including a comparing/adjusting means operative, when the amount of variation in the output of said distance sensor is within a threshold for a set value of the gap between the discharge port of said nozzle and the surface of said substrate, so that said control means adjusts the gap between the discharge port of said nozzle and the surface of said substrate to a predetermined value and, said comparing/adjusting means being also operative, when the amount of variation in the output of said distance sensor exceeds said threshold, so that said control means stops said adjusting to fix the gap between the discharge port of said nozzle and the surface of said substrate to a value the same as one obtained just before the deviation takes place.

* * * * *